United States Patent
Inaba

[11] Patent Number: 6,139,409
[45] Date of Patent: Oct. 31, 2000

[54] WAFER POLISHING APPARATUS AND BACKING PAD FOR WAFER POLISHING

[75] Inventor: Shoichi Inaba, Tokyo, Japan

[73] Assignee: NEC Corporation, Tokyo, Japan

[21] Appl. No.: 09/323,121

[22] Filed: Jun. 1, 1999

[30] Foreign Application Priority Data

May 29, 1998 [JP] Japan .................................. 10-149044

[51] Int. Cl.[7] ............................................... B24B 7/22
[52] U.S. Cl. ........................................ 451/288; 451/398
[58] Field of Search .................................. 451/288, 287, 451/41, 398, 388

[56] References Cited

U.S. PATENT DOCUMENTS

| | | | |
|---|---|---|---|
| 4,521,995 | 6/1985 | Sekiya | 451/388 |
| 5,267,418 | 12/1993 | Currie et al. | 451/41 |
| 5,645,474 | 7/1997 | Kubo et al. | 451/388 |
| 5,762,539 | 6/1998 | Nakashiba et al. | 451/388 |
| 5,791,973 | 8/1998 | Nishio | 451/288 |
| 5,938,512 | 8/1999 | Takei et al. | 451/388 |

FOREIGN PATENT DOCUMENTS

| | | |
|---|---|---|
| 8-187655 | 7/1996 | Japan . |
| 9-139366 | 5/1997 | Japan . |
| 9-155730 | 6/1997 | Japan . |
| 9-260318 | 10/1997 | Japan . |

Primary Examiner—Robert A. Rose
Attorney, Agent, or Firm—Sughrue, Mion, Zinn, Macpeak & Seas, PLLC

[57] ABSTRACT

A wafer polishing apparatus includes a rotatably supported polishing table, a pad, a carrier head, and a backing pad. The pad is fixed to the polishing table. The carrier head is arranged to oppose the polishing table and is supported to be rotatable and movable forward/backward with respect to the polishing table. The backing pad is fixed to a surface of the carrier head which opposes the polishing pad, and presses a wafer against the polishing pad by cooperation with compressed air. The backing pad is constituted by an annular foamed body having closed cells to press an outer peripheral portion of the wafer, and a columnar second foamed body having open cells and provided inside the first foamed body.

13 Claims, 6 Drawing Sheets

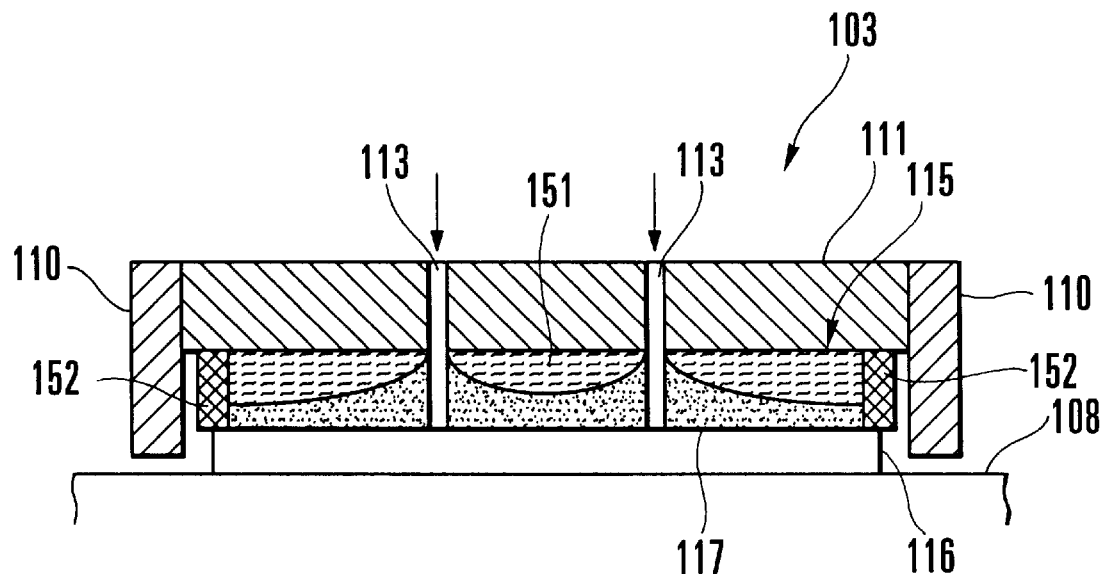
F I G. 2 A
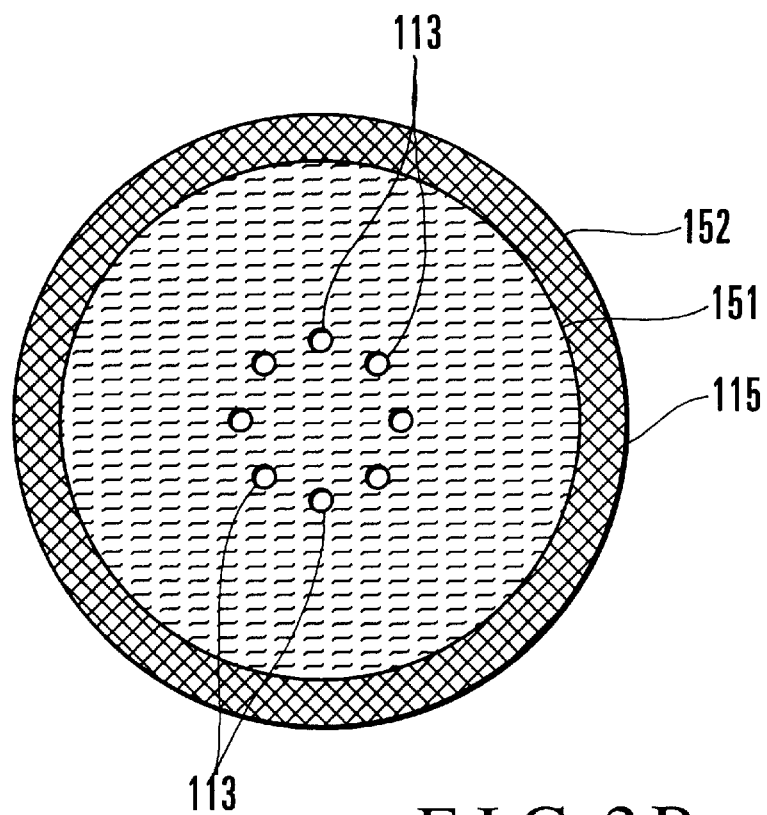
F I G. 2 B

WAFER POLISHING APPARATUS AND BACKING PAD FOR WAFER POLISHING

BACKGROUND OF THE INVENTION

The present invention relates to a wafer polishing apparatus employing CMP (Chemical-Mechanical Polishing) and a backing pad for wafer polishing.

In a semiconductor device manufacturing process, a planarizing process for planarizing the surface of a semiconductor wafer is performed to improve the precision of photolithography and the like. A typical example of this planarizing process is SOG (Spin On Glass). As the micro-patterning degree of semiconductor devices increases, higher-degree planarization is required. In order to satisfy this demand, in recent years, CMP using polishing cloth impregnated with a chemical etching solution attracts attention, and is becoming the mainstream technique including the Damascene method for planarization.

FIG. 4A shows a wafer polishing apparatus using conventional CMP.

Referring to FIG. 4A, a wafer polishing apparatus entirely denoted by reference numeral 1 is constituted by a circular polishing table 2, a columnar carrier head 3, and a slurry supply pipe 4. The carrier head 3 opposes the polishing table 2 and has a smaller diameter than that of the polishing table 2. The slurry supply pipe 4 drops slurry 5. A spindle 6 rotatably supporting the polishing table 2 is fixed to the center of the lower portion of the polishing table 2. A soft lower pad 7 and a hard upper pad 8 stacked on it are sequentially fixed to the upper surface of the spindle 6.

The carrier head 3 is constituted by an annular retainer ring 10, a stainless steel base plate 11, and a spindle 12. The base plate 11 is fixed to be buried in the upper half of the retainer ring 10. The spindle 12 is fixed to the center of the upper portion of the base plate 11 to rotatably support the carrier head 3. A backing pad 15 is fixed to the lower surface of the base plate 11. Six air pipes 13, circularly arranged, as shown in FIG. 4B, are formed to extend through the base plate 11 and backing pad 15. Compressed air is supplied from an air supply source (not shown) provided above the base plate 11 to the air pipes 13.

In this arrangement, the carrier head 3 is moved downward to press a wafer 16 against the upper pad 8 with the lower surface of the backing pad 15. After that, air is supplied from the air supply source (not shown) to the air pipes 13 to form an air layer between the backing pad 15 and wafer 16. In this state, the polishing table 2 is rotated in the direction of an arrow while the carrier head 3 is rotated in a direction opposite to the rotational direction of the polishing table 2, and the slurry 5 is dropped from the slurry supply pipe 4, so that the lower surface of the wafer 16 is polished by the upper pad 8.

FIG. 5A shows a conventional head using a backing pad for wafer polishing which is formed of a foamed body having open cells. FIG. 6A shows a conventional head using a backing pad for wafer polishing which is formed of a foamed body having closed cells.

When a backing pad 25 is formed of only a foamed body having open cells, as shown in FIG. 5A, it is entirely polished substantially uniformly, as shown in FIG. 5B. However, the polishing amount is small, and even if the air pressure is increased, a decrease in polishing amount cannot be improved. A drop in polishing amount is large near the outer peripheral edge portion of a wafer 16. A decrease in polishing amount is found to typically occur when the outer diameter of the wafer 16 exceeds 8 inches.

This is supposed to be based on the following reason. A foamed body having open cells has a specific nature of high air transmission in the lateral direction (along the surface of the wafer 16). Hence, an air layer 17 is formed uniformly between the backing pad 25 and wafer 16, and accordingly the wafer 16 can be easily polished flat. However, since the air layer 17 spreads over the entire surface of the backing pad 25, pressing of the backing pad 25 against the wafer 16 depends on the air layer 17. The wafer 16 thus becomes less influenced by pressing the backing pad 25, resulting in a small polishing amount.

The reason why the polishing amount of the wafer 16 drops largely at the outer peripheral edge portion is as follows. As shown in FIG. 5A, the air layer 17 tends to be released from the outer peripheral portion of the backing pad 25 to the outside, and the backing pad 25 cannot press the outer peripheral edge portion of the wafer 16 supposed to be pressed.

When a backing pad 35 is formed of only a foamed body having closed cells, as shown in FIG. 6A, the polishing amounts at two measurement points separated from a center C of a wafer 16 by 1 inch to 8 inches are larger than those at other measurement points. This leads to variations in polishing amount as a whole. However, the overall polishing amount is improved by increasing the air pressure.

This may be based on the following reason. A foamed body having closed cells has such a specific nature that, although its air transmission is low in the lateral direction (along the surface of the wafer 16), it can locally apply a pressure to the wafer. As a result, as shown in FIG. 6A, a portion where an air layer 17 is formed and a portion where it is not formed are produced between the backing pad 35 and wafer 16. Hence, the entire surface of the wafer 16 is not uniformly pressed by the air layer 17, so that the surface of the wafer 16 cannot be polished flat.

FIGS. 5B and 6B show graphs of the polishing amounts of the wafer 16 at measurement points separated from the center C of the wafer 16 having a diameter of 8 inches in the radial direction by 1 inch, which are obtained by using the backing pads shown in FIGS. 5A and 6B.

SUMMARY OF THE INVENTION

It is an object of the present invention to provide a wafer polishing apparatus and a backing pad for wafer polishing, which can polish an entire target surface of the wafer uniformly.

It is another object of the present invention to provide a wafer polishing apparatus and a backing pad for wafer polishing, which aim at an increase in wafer polishing amount.

In order to achieve the above object, according to the present invention, there is provided a wafer polishing apparatus comprising a rotatably supported polishing table, a polishing pad fixed to the polishing table, a carrier head arranged to oppose the polishing table and supported to be rotatable and movable forward/backward with respect to the polishing table, and a backing pad fixed to a surface of the carrier head which opposes the polishing pad to press a wafer against the polishing pad by cooperation with compressed air, the backing pad being constituted by an annular first foamed body having closed cells to press an outer peripheral portion of the wafer, and a columnar second foamed body having open cells and provided inside the first foamed body.

BRIEF DESCRIPTION OF THE DRAWINGS

FIG. 2A is a schematic view of a carrier head portion shown in FIG. 1, and FIG. 2B is a bottom view of a backing pad shown in FIG. 2A;

DESCRIPTION OF THE PREFERRED EMBODIMENTS

The present invention will be described in detail with reference to the accompanying drawings.

Figure 1:
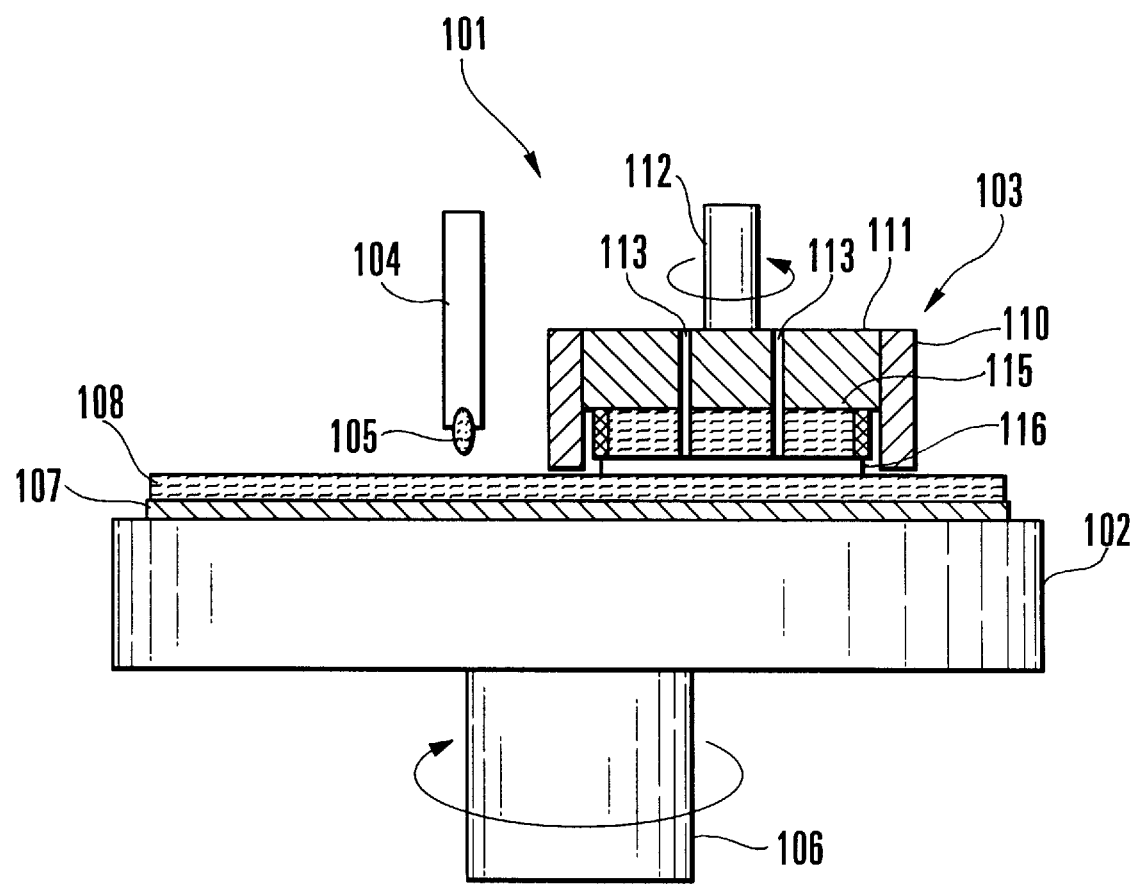
FIG. 1 is a sectional view of a wafer polishing apparatus according to the first embodiment of the present invention.

FIG. 1 shows a wafer polishing apparatus according to the first embodiment of the present invention. Referring to FIG. 1, a wafer polishing apparatus entirely denoted by reference numeral 101 is constituted by a thick, circular polishing table 102, a columnar carrier head 103, and a slurry supply pipe 104. The carrier head 103 opposes the polishing table 102, is supported to be vertically movable, and has a smaller diameter than that of the polishing table 102. The slurry supply pipe 104 drops slurry 105.

A spindle 106 rotatably supporting the polishing table 102 is fixed to the center of the lower portion of the polishing table 102. A soft lower pad 107 and a hard upper pad 108 that are stacked and are fixed to the upper surface of the polishing table 102.

As shown in FIG. 2A, the carrier head 103 is constituted by an annular retainer ring 110, a stainless steel base plate 111, and a spindle 112. The base plate 111 is fixed to be buried in the upper half of the retainer ring 110. The spindle 112 is fixed to the center of the upper portion of the base plate 111 to rotatably support the carrier head 310.

A backing pad 115 is fixed to the lower surface of the base plate 111. Six air pipes 113, arranged circularly equidistantly as shown in FIG. 2B, are formed to extend through the base plate 111 and backing pad 115. Compressed air is supplied from an air supply source (not shown) provided above the base plate 111 to the air pipes 113.

The backing pad 115 is constituted by an annular foamed body 152 corresponding to the outer peripheral portion of a wafer 116 and having closed cells (foamed type), and a columnar foamed body 151 formed at the central portion of the wafer 116 surrounded by the annular foamed body 152 and having open cells (unwoven fabric type). FIG. 2A shows a state wherein the foamed body 151 having the open cells is deformed by the air pressure.

In the wafer polishing apparatus having the above arrangement, first, the carrier head 103 holding the wafer 116 is moved downward to press it against the upper pad 108 on the rotating polishing table 102 through the backing pad 115. In this state, when compressed air is supplied from the air pipes 113 to the portion between the backing pad 115 and wafer 116, as the foamed body 151 having the open cells has the specific nature of high air transmission in the lateral direction (along the surface of the wafer 116), the compressed air forms an almost uniform air layer 117 between the backing pad 115 and wafer 116. Hence, the lower surface of the wafer 116 can be entirely polished flat.

Since the foamed body 152 corresponding to the outer peripheral portion of the backing pad 115 and having the closed cells can apply a predetermined pressure to the outer peripheral edge portion of the wafer 116, the air layer 117 formed between the backing pad 115 and wafer 116 is prevented from being released from the outer peripheral portion of the backing pad 115.

Figure 5A:
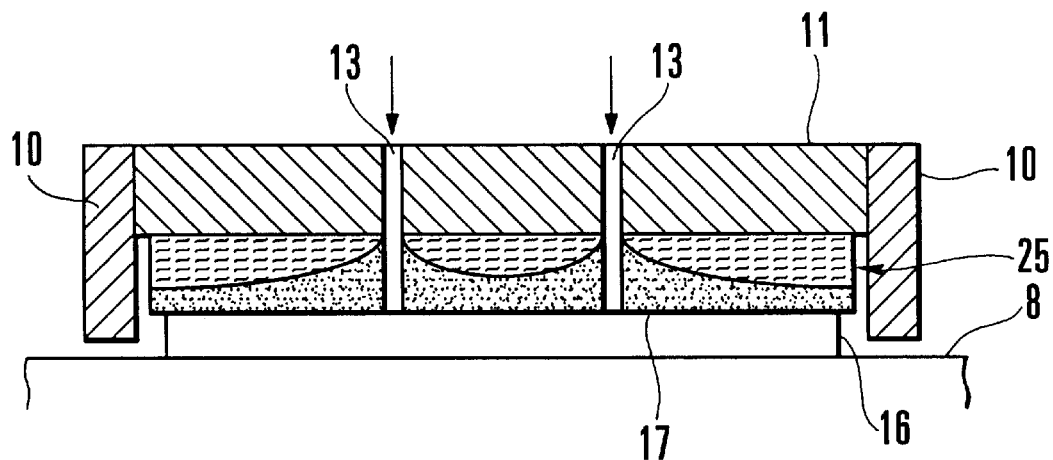
FIG. 5A is a sectional view of a conventional carrier head portion using a backing pad made of a foamed body having open cells.
Figure 5B:
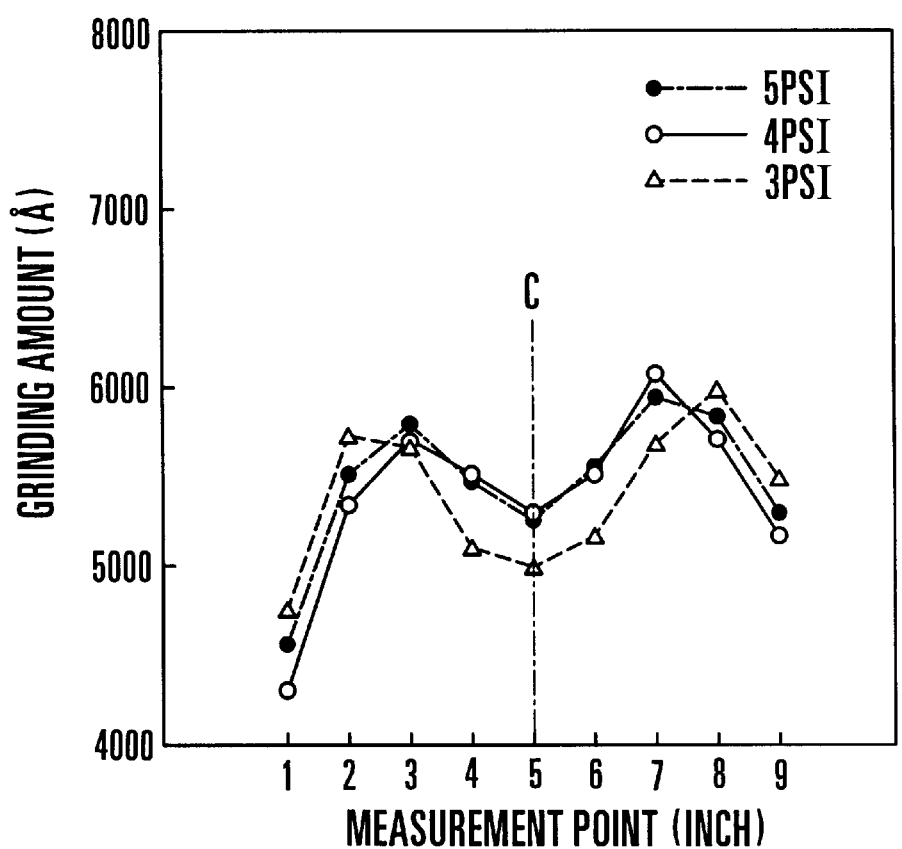
FIG. 5B is a graph showing the relationship between a distance from the center of the wafer and a polishing amount when the head shown in FIG. 5A is used.
Figure 6A:
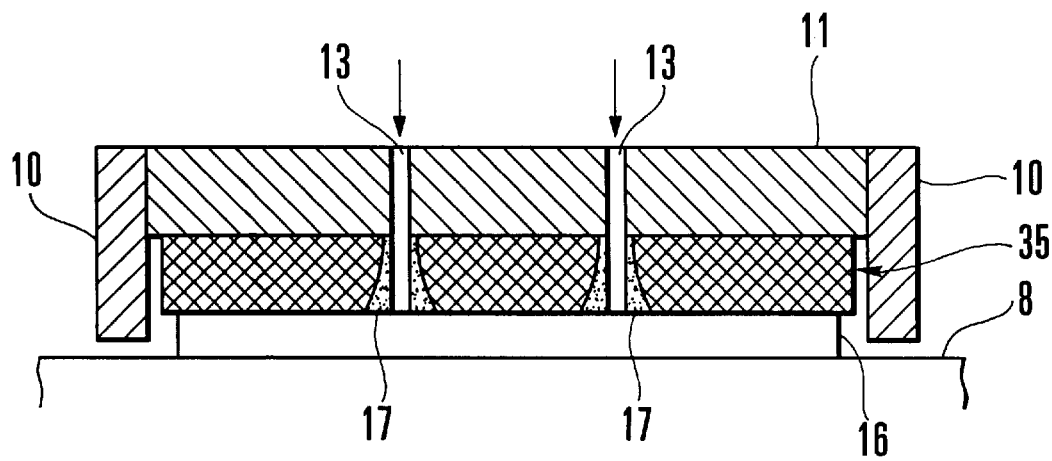
FIG. 6A is a sectional view of a head portion using a backing pad for wafer polishing made of a foamed body having closed cells.
Figure 6B:
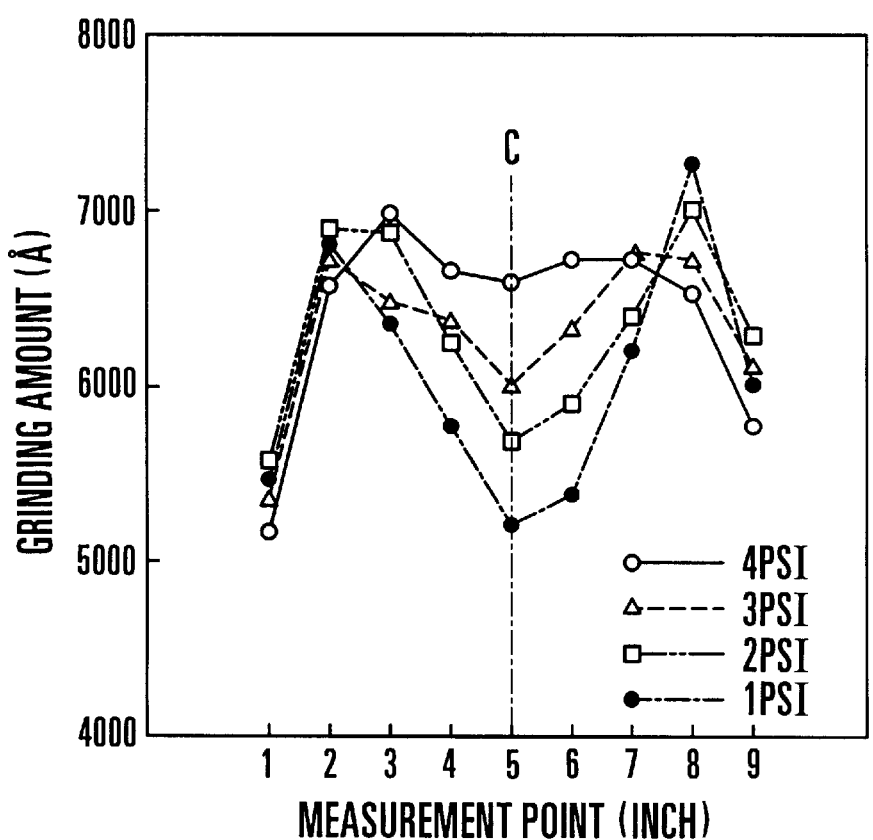
FIG. 6B is a graph showing the relationship between a distance from the center of the wafer and a polishing amount when the head shown in FIG. 6A is used.

Therefore, as compared to a case wherein the backing pad 25 is made of only a foamed body having open cells as in the prior art (FIG. 5A), a decrease in polishing amount at the outer peripheral edge portion of the wafer 116 can be prevented (improved), and the entire surface of the wafer 116 can be polished uniformly.

Figure 3A:
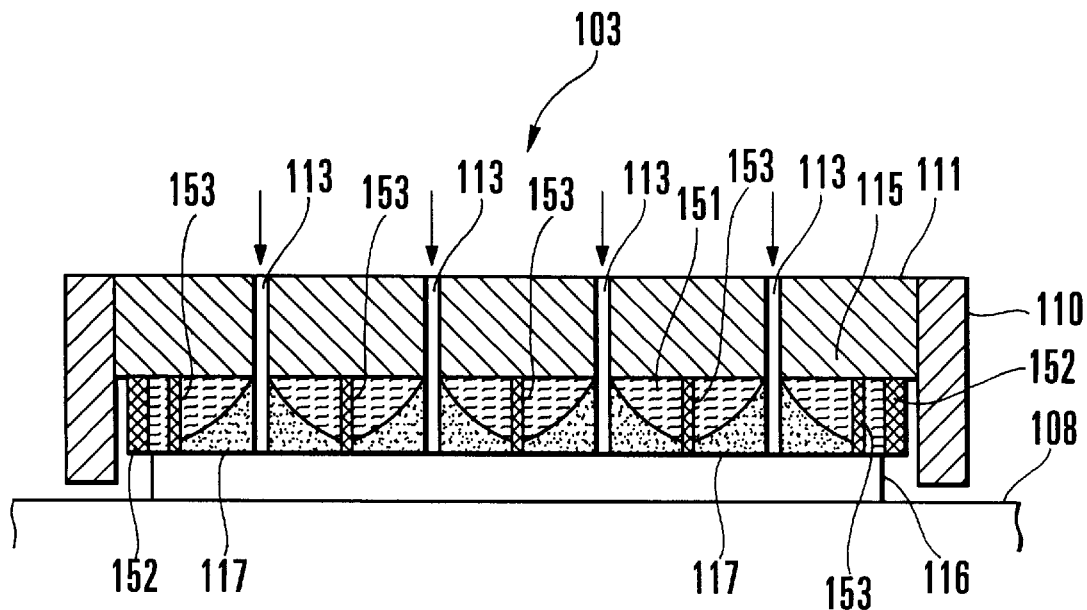
FIG. 3A is a schematic view of a carrier head portion according to the second embodiment of the present invention.
Figure 3B:
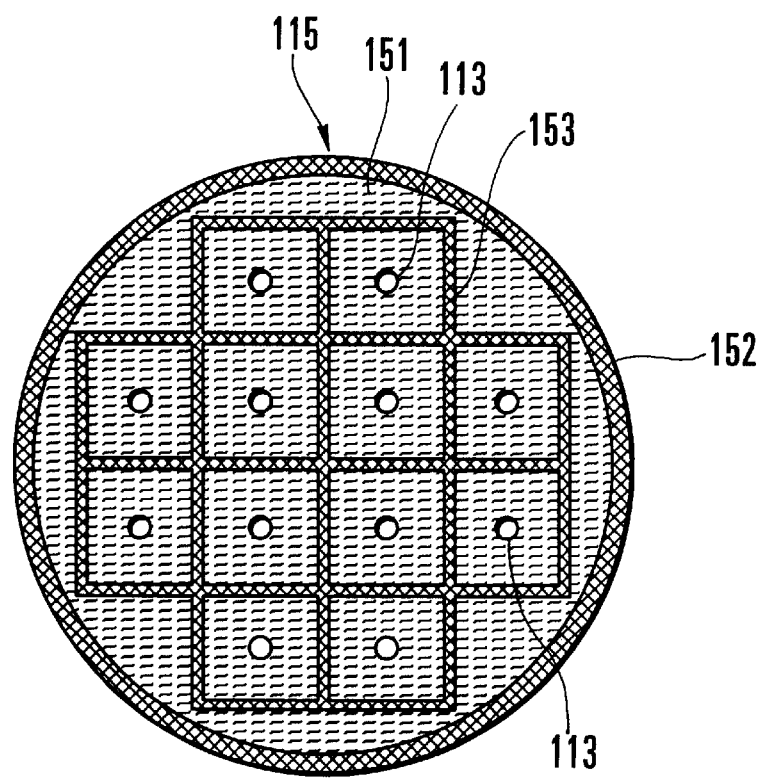
FIG. 3B is a bottom view of a backing pad shown in FIG. 3A.
Figure 4A:
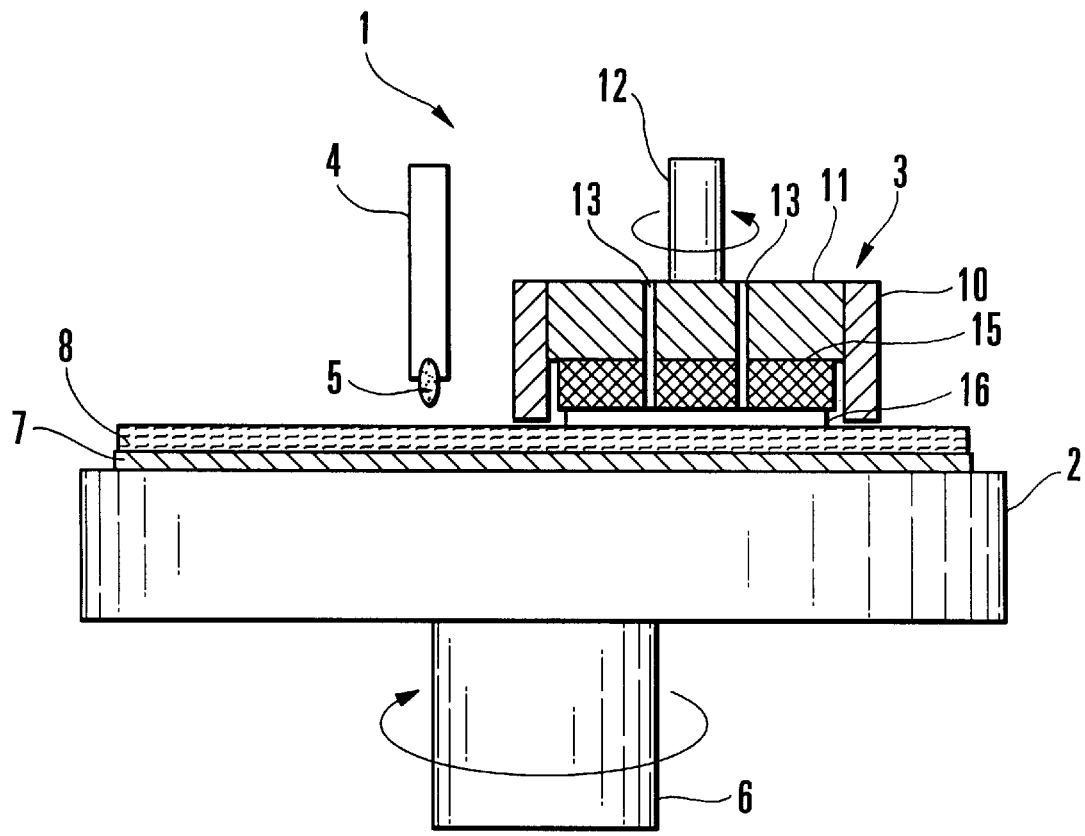
FIG. 4A is a sectional view of a conventional wafer polishing apparatus using CMP.
Figure 4B:
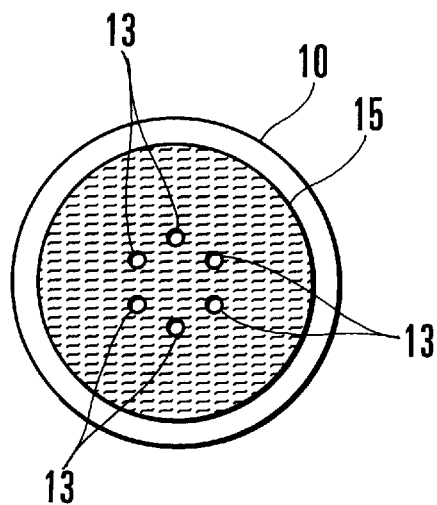
FIG. 4B is a bottom view of a backing pad shown in FIG. 4A.

FIG. 3A shows a head according to the second embodiment of the present invention.

In this embodiment, in addition to the arrangement of the first embodiment described above, a matrix type partition 153 made of a foamed body having closed cells is provided. The partition 153 partitions a foamed body 151 having open cells in the annular foamed body 152 having closed cells into a plurality of small compartments. Air pipes 113 are formed to extend through the foamed body 151 in the compartments surrounded by the partition 153, and a base plate 111.

In the wafer polishing apparatus having the above arrangement, the partition 153 can prevent a local decrease in polishing amount of a wafer 116 at a region corresponding to the foamed body 151 having the open cells. More specifically, since the partition 153 can partially increase a pressure to the wafer 116 in units of compartments, the polishing amount can be increased. As a result, the polishing amount of the wafer 116 can be entirely, uniformly increased.

In the second embodiment, the partition 153 is formed into a matrix. However, the shape of the partition 153 is not limited to this, but can be formed into a concentric or honeycomb shape. It suffices if the partition 153 can partition the foamed body 151 into a plurality of small compartments. The air pipes 113 need not be provided to all the small compartment surrounded by the partition 153.

A practical example of the backing pad according to the present invention will be described.

A foamed body 151 having open cells and a foamed body 152 having closed cells were formed of polyurethane having a compressivity of 30%. When the foamed body 152 having closed cells was formed of polyurethane having a compressivity of 18% to 5%, the polishing amount was improved.

The partition 153 is formed of polyurethane having the same compressivity as that of the foamed body 152. As the material of the foam bodies 151 and 152 and the partition 153, other than polyurethane, for example, a porous ceramic material and a Teflon-based resin can be used.

As has been described above, according to the present invention, a decrease in polishing amount at the outer peripheral edge portion of the wafer can be prevented, so that the wafer can be polished entirely uniformly. Also, the entire surface of the wafer can be uniformed, and the wafer polishing amount can be increased.

What is claimed is:

1. A wafer polishing apparatus comprising:
   a rotatably supported polishing table;
   a polishing pad fixed to said polishing table;
   a carrier head arranged to oppose said polishing table and supported to be rotatable and movable forward/backward with respect to said polishing table; and
   a backing pad fixed to a surface of said carrier head which opposes said polishing pad to press a wafer against said polishing pad by cooperation with compressed air, said backing pad being constituted by an annular first foamed body having closed cells to press an outer peripheral portion of the wafer, and a columnar second foamed body having open cells and provided inside said first foamed body.

2. An apparatus according to claim 1, further comprising a partition for partitioning said second foamed body into a plurality of small compartments.

3. An apparatus according to claim 2, wherein said partition is made of a third foamed body having closed cells.

4. An apparatus according to claim 2, wherein said partition is formed into a matrix.

5. An apparatus according to claim 2, wherein said partition is formed concentrically.

6. An apparatus according to claim 2, wherein said partition is formed into a honeycomb shape.

7. An apparatus according to claim 1, further comprising a plurality of air pipes formed in said carrier head to supply the compressed air to a portion between said second foamed body and the wafer.

8. A backing pad fixed to a surface of a carrier head which opposes a polishing pad to press a wafer against said polishing pad by cooperation with compressed air, comprising:
   an annular first foamed body having closed cells to press an outer peripheral portion of the wafer; and
   a columnar second foamed body provided inside said first foamed body and having open cells.

9. A pad according to claim 8, further comprising a partition for partitioning said second foamed body into a plurality of small compartments.

10. A pad according to claim 9, wherein said partition is made of a third foamed body having closed cells.

11. A pad according to claim 9, wherein said partition has a matrix shape.

12. A pad according to claim 9, wherein said partition has a concentric shape.

13. A pad according to claim 9, wherein said partition has a honeycomb shape.

* * * * *